(12) United States Patent
Arai

(10) Patent No.: US 7,208,790 B2
(45) Date of Patent: *Apr. 24, 2007

(54) SEMICONDUCTOR DEVICE INCLUDING A MEMORY UNIT AND A LOGIC UNIT

(75) Inventor: Shintaro Arai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/497,236

(22) Filed: Aug. 2, 2006

(65) Prior Publication Data

US 2007/0035984 A1 Feb. 15, 2007

(30) Foreign Application Priority Data

Aug. 11, 2005 (JP) .............................. 2005-233225

(51) Int. Cl.
  *H01L 27/108* (2006.01)
  *H01L 29/76* (2006.01)
  *H01L 29/94* (2006.01)
  *H01L 31/119* (2006.01)

(52) U.S. Cl. ................. 257/296; 257/306; 257/E27.048
(58) Field of Classification Search ................. 257/296, 257/306, E27.048
See application file for complete search history.

(56) References Cited

U.S. PATENT DOCUMENTS

| | | | |
|---|---|---|---|
| 4,811,076 A * | 3/1989 | Tigelaar et al. ............. | 257/306 |
| 6,104,052 A * | 8/2000 | Ozaki et al. ................. | 257/296 |
| 6,690,050 B2 * | 2/2004 | Taniguchi et al. .......... | 257/296 |
| 2004/0089913 A1 * | 5/2004 | Yano et al. .................. | 257/508 |
| 2005/0056876 A1 * | 3/2005 | Miyatake et al. ........... | 257/296 |
| 2005/0087817 A1 * | 4/2005 | Zhang ......................... | 257/390 |

FOREIGN PATENT DOCUMENTS

JP    2003-031690    1/2003

\* cited by examiner

*Primary Examiner*—Ngân V. Ngô
(74) *Attorney, Agent, or Firm*—Young & Thompson

(57) ABSTRACT

In a semiconductor device including a memory unit and a logic unit, a generation of a step in a terminal end surface of an electroconductive plug in a region above a capacitor element is inhibited. Such semiconductor device includes an insulating layer provided on the semiconductor substrate extending from the memory unit to the logic unit; a plurality of second interconnect connecting plugs embedded in the interlayer insulating film and the interlayer insulating film in the logic unit; capacitor elements embedded in the interlayer insulating film in memory unit; and dummy plugs, embedded in the interlayer insulating film and the interlayer insulating film in a region above a region that is provided with the capacitor element in the memory unit, and insulated from the capacitor element. A plurality of second interconnect connecting plugs and the dummy plug are terminated in the top surface of the interlayer insulating film.

7 Claims, 16 Drawing Sheets

SEMICONDUCTOR DEVICE INCLUDING A MEMORY UNIT AND A LOGIC UNIT

The present application is based on Japanese patent application No. 2005-233,225, the content of which is incorporated hereinto by reference.

BACKGROUND

1. Technical Field

The present invention relates to a semiconductor device and a method for manufacturing thereof, and in particular, relates to a semiconductor device that is embedded with a memory unit and a logic unit in one device, and a method for manufacturing thereof.

2. Related Art

Typical conventional semiconductor device comprising a memory device is described in Japanese Patent Laid-Open No. 2003-31,690. Japanese Patent Laid-Open No. 2003-31,690 describes a phenomenon caused in a device containing a dynamic random access memory (DRAM) and a logic unit that a difference between a height of a region of DRAM from the substrate and a height of a region of the logic unit is beyond an allowable level for conducting a chemical mechanical polishing after forming an upper capacitor electrode. Further, it is described that this phenomenon is caused because no upper capacitor electrode is included in the logic region while a cell plate (upper capacitor electrode) is included in the DRAM region. Further, according to Japanese Patent Laid-Open No. 2003-31,690, a difference is created in the thickness of the insulating film on a memory cell between a central portion of the memory cell of the DRAM region and an end portion thereof, due to the difference in their height from the substrate created between the DRAM region and the logic region, causing problems such as a difficulty in controlling the polishing operation in a chemical mechanical polishing (CMP) process, unwanted exposure of the upper capacitor electrode and the like.

It is also described in Japanese Patent Laid-Open No. 2003-31,690 that, in order to provide solutions to these problems, a cell pattern is also formed in the logic region in addition to the DRAM region that requires the upper capacitor electrode to prevent a step from causing between the DRAM region and the logic region. It is further described that an insulating film for functioning as a stopper film for the CMP process may also be provided on the upper capacitor electrode layer. Although a difference in the film thickness is created between the DRAM and the interlayer insulating film on the memory cell in the logic region in this case, a function as a stop film for the polishing operation in the CMP process is presented to the insulating film, in order to prevent an exposure of the upper capacitor electrode in the end of the memory cell.

SUMMARY OF THE INVENTION

However, the present inventor has eagerly investigated and found that a new phenomenon described below, which causes corresponding to miniaturizations of devices and was not conventionally recognized, has manifested. More specifically, when a first interconnect layer is formed in a semiconductor device that includes a memory unit and a logic unit in one device, problems such as an insufficient exposure margin in an exposure process for exposing an interlayer insulating film composing the first interconnect layer, an unwanted polishing remainder of a Cu film composing the first interconnect, and the like may be caused.

Under such defective situations, there has been a concern that a decrease in the manufacturing production yield due to a failure caused in a process for forming the first interconnect.

Therefore, the present inventor has been further conducted investigations for clarifying a factor for such defective situations. It has been found as a result of these investigations that an erosion is found in the logic unit during the formation of the contact plug, as a dimension of contact plug in the logic unit, or, in particular, an interval between the contacts, becomes to be considerably reduced. The erosion occurred during the formation of the contact plug was not recognized in the conventional technology, and the phenomenon does not manifest until the situation of a requirement for reducing intervals between the contact plugs coupled to the first interconnect.

Further, the present inventor has further found that such erosion is considerably caused in a region where difference in data ratio is larger between the memory unit and the logic unit. More specifically, when a contact plug is formed, tungsten (W) is generally embedded via a chemical vapor deposition (CVD) process. Then, excess W on a wafer is removed by a chemical mechanical polishing (CMP) process. Here, in a device that includes a memory unit and a logic unit in one device, since remarkably few contacts are included in an upper region of a capacitor element in the memory unit, data ratio in contacts in the logic unit is considerably different from data ratio in contacts in the memory unit. Consequently, when the contact plug is formed in the logic unit, the erosion caused during the CMP process for the W film serving as the contact plug is considerable. In particular, the erosion is considerably caused in regions where contacts are formed in closely packed pattern, like a static random access memory (SRAM) on a chip.

When an erosion is caused in the logic unit, a step is created between the logic unit and the memory unit, which includes contacts in loosely packed pattern such as the DRAM unit. Creation of such step leads to the defective situations described above, if the formed first interconnect is in failure. Such defective situation causes a decrease in manufacturing stability for manufacturing a semiconductor device or a decrease in production yield, and therefore these problems should be solved.

The present inventor has eagerly conducted investigations for effectively inhibiting a creation of the step between the memory unit and the logic unit on the basis of the above-described scientific knowledge, eventually presenting the present invention.

According to one aspect of the present invention, there is provided a semiconductor device that includes a memory unit and a logic unit in a semiconductor substrate, comprising: an insulating layer provided on the semiconductor substrate extending from the memory unit to the logic unit; a plurality of electro conductive plugs embedded in the insulating layer in the logic unit; a capacitor element embedded in the insulating layer in the memory unit; and a dummy electrically conductive film, embedded in the insulating layer in a region above a region that is provided with the capacitor element in the memory unit, and insulated from the capacitor element, wherein the plurality of electro conductive plugs and the dummy electrically conductive film are terminated in a top surface of the insulating layer.

In the present invention, the dummy electrically conductive film, is provided in a space above the capacitor element in the memory unit. The dummy electrically conductive film is a film embedded in the insulating layer, and is provided in order to adjust a height of a top surface of the insulating layer. The dummy electrically conductive film may be insulated by a capacitor element in the lower surface thereof, and may be connected to a conductive member such as an interconnect and the like provided on the insulating layer, or may be coated with an upper insulating film to obtain an insulation therefrom, in the top surface thereof. A short-circuit between the dummy electrically conductive film and the electrode of the capacitor element can be prevented by providing a configuration for insulating the dummy electrically conductive film from the capacitor element in the lower surface thereof.

In the semiconductor device according to the present invention, the dummy electrically conductive film is embedded in the insulating layer in the region above a region that is provided with the capacitor element of the memory unit. The device is configured that both of plurality of electro conductive plugs provided in the logic unit and the dummy electrically conductive film provided in the memory unit are terminated in the top surface of the insulating layer. A difference between the data ratio of the memory unit and the data ratio of the logic unit in the top surface of the insulating layer can be reduced by providing such dummy electrically conductive film in the memory unit.

In conventional semiconductor devices, a region above the region that is provided with the capacitor element in the memory unit exhibits lower data ratio. Consequently, an erosion is caused in the top surface of the insulating layer during the process for forming a plurality of electroconductive plugs provided in the logic unit, and thus a step may be created between the memory unit and the logic unit. On the contrary, according to the present invention, the dummy electrically conductive film is provided in the region above the region provided with the capacitor element, so that data ratio in the top surface of the insulating layer can be increased, thereby reducing the difference with the data ratio in the logic unit. Thus, even if a plurality of electroconductive plugs are arranged on the top surface of the insulating layer in a closely packed arrangement, problems such as, for example, an insufficient exposure margin in the process for forming the interconnects above the insulating layer and a generation of residues in the CMP process for the interconnects or electrically conductive films can be inhibited. Therefore, according to the present invention, an erosion caused in the logic unit can be inhibited, and thus a step in the top surface of the insulating layer created between the memory unit and the logic unit can be inhibited. Consequently, the semiconductor device of the present invention is configured to achieve an improved production yield or an improved throughput.

In addition to above, in this specification, the data ratio is defined as a ratio of area of the metallic film over area of the insulating layer. The device according to the present invention may be configured that an area occupied by the dummy electrically conductive film in the memory unit, for example, is substantially equivalent to an area occupied by the electroconductive plugs in the logic unit. Further, device according to the present invention may also be configured that the data ratio of the dummy electrically conductive film in the memory unit is within a range of from 1% to 10%. This can further ensure a prevention of a creation of a step in the top surface of the insulating layer between the memory unit and the logic units.

Further, in the present invention, the insulating layer may be in a form of a monolayer or multiple layers composed of a plurality of deposited insulating films. In addition, in the present invention, the electroconductive plug may be configured to be composed of a single plug, or may be configured to be a plurality of plugs that are electrically coupled.

The device according to the present invention may also be configured that the memory unit further includes a bit line, and a capacitor element is provided above the bit line. When the device has a capacitor over bit line (COB) structure, which includes a capacitor element provided above the bit line, no bit line-connecting plug is provided in a region above the capacitor element, so that the data ratio in the region above the capacitor element is further reduced, as compared with a capacitor under bit line (CUB) structure. Consequently, the difference in the data ratios caused between the memory unit and the logic unit in the top surface of the insulating layer is further increased, and a requirement for reducing intervals between the electroconductive plugs causes a considerable erosion in the top surface of the insulating layer in the logic unit. Consequently, the height of the step between the memory unit and the logic unit is further increased. Since the dummy electrically conductive film is provided in the memory unit according to the present invention, a creation of a step in the top surface of the insulating layer between the memory unit and the logic unit can be inhibited, even if such COB structure is adopted. Consequently, the device according to the present invention can be configured to provide an improved manufacturing stability for manufacturing the upper layer of the insulating layer.

According to another aspect of the present invention, there is provided a method for manufacturing a semiconductor device including a memory unit and a logic unit, comprising: forming a capacitor element above a device-forming surface of the semiconductor substrate; forming an insulating layer above the semiconductor substrate after the forming the capacitor element, the insulating layer extending from a region for forming the memory unit to a region for forming the logic unit and covering a top surface of the capacitor element; and simultaneously forming an electroconductive plug and a dummy electrically conductive film in the logic unit and in the memory unit, respectively, after the forming the insulating layer, including: selectively removing portions of the insulating layer in a predetermined region of the logic unit and predetermined region of the memory unit to form a first concave portion and a second concave portion in the logic unit and in the memory unit, respectively; forming an electrically conductive film to fill the first concave portion and the second concave portion therewith; and removing portions of the electrically conductive film formed outside of the first concave portion and outside of the second concave portion, wherein, in the simultaneously forming the electroconductive plug and the dummy electrically conductive film, the bottom surface of the second concave portion is provided to be separated from the top surface of the capacitor element.

According to the above-described aspect of the present invention, the electroconductive plug and the dummy electrically conductive film are simultaneously formed in the logic unit and in the memory unit, respectively, so that an erosion caused in the top surface of the region for forming the electroconductive plug can be inhibited in the logic unit, thereby providing a reduced step height in the top surface of the insulating layer caused between the memory unit and the logic unit. Consequently, a failure caused in a process for forming the upper layer of the insulating layer can be inhibited, thereby providing an improved manufacturing stability.

It is to be understood that the invention is capable of use in various other combinations, modifications, and environments, and any other exchange of the expression between the method and device or the like according to the present invention may be effective as an alternative of an embodiment according to the present invention.

For example, in the present invention, the memory unit may be configured to include a DRAM cell. Having such configuration, the structure of the capacitor element can be simplified, leading to a further improved degree of flexibility in the design of the memory unit.

As described above, according to the present invention, in a semiconductor device including a memory unit and a logic unit, a technology for inhibiting a generation of a step in a terminal end surface of an electroconductive plug in a region above a capacitor element can be achieved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be repeated.

First Embodiment

Figure 1:
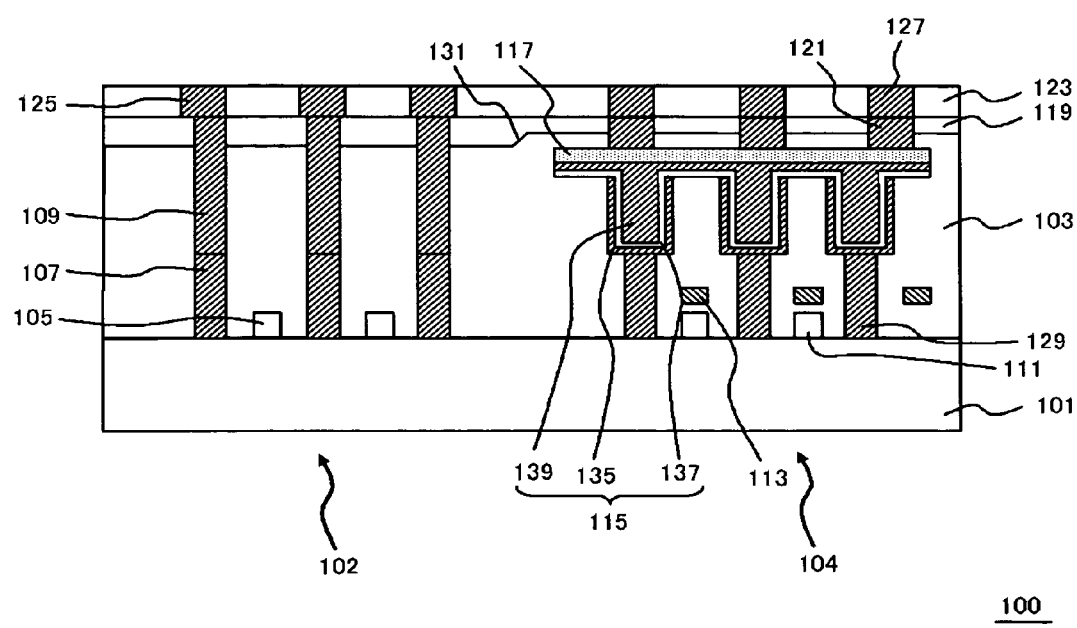
FIG. 1 is a cross-sectional view, schematically illustrating a configuration of a semiconductor device according to an embodiment.
Figure 2:
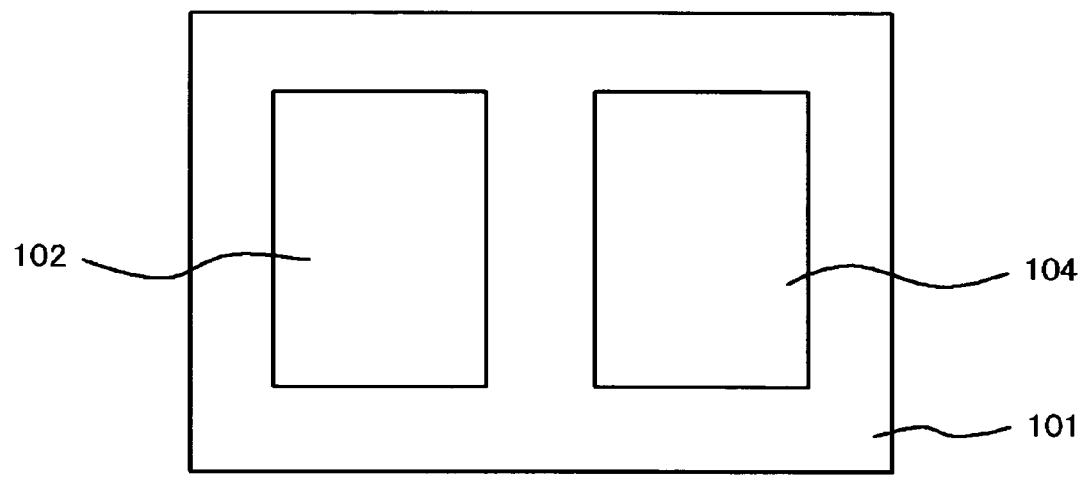
FIG. 2 is a plan view, illustrating a component of the semiconductor device shown in FIG. 1.

FIG. 1 is a cross-sectional view, schematically illustrating a configuration of a semiconductor device according to the present embodiment. FIG. 2 is a plan view, illustrating a configuration of the semiconductor device 100 shown in FIG. 1. A Semiconductor device 100 shown in FIG. 1 is a semiconductor device, which is embedded with a memory unit 104 and a logic unit 102 in a semiconductor substrate (silicon substrate 101). The logic unit 102 may include a peripheral circuit for the memory unit 104. Semiconductor device 100 includes:

an insulating layer (interlayer insulating film 103 and interlayer insulating film 119) provided on the semiconductor substrate 101 extending from the memory unit 104 to the logic unit 102;

a plurality of electroconductive plugs (second interconnect connecting plugs 109) embedded in the interlayer insulating film 103 and the interlayer insulating film 119 in the logic unit 102;

capacitor elements 115 embedded in the interlayer insulating film 103 in memory unit 104; and dummy electrically conductive films (dummy plugs 121), embedded in the interlayer insulating film 103 and the interlayer insulating film 119 in a region above a region that is provided with the capacitor element 115 in the memory unit 104, and insulated from the capacitor element 115.

The dummy plug 121 is provided extending from the interlayer insulating film 103 to the interlayer insulating film 119, extends through the interlayer insulating film 119, and is terminated at the top surface thereof. The dummy plug 121 is a film that serves as adjusting a level of the top surface of the interlayer insulating film 119. More specifically, the dummy plug 121 provides a suitable adjustment for an irregularity of the levels in the interlayer insulating film 119 caused between the region above the logic unit 102 and the region above the memory unit 104. The dummy plug 121 functions as inhibiting a creation of a step in the top surface of the interlayer insulating film 119, and planarizing the top surface from the memory unit 104 to the logic unit 102.

A plurality of second interconnect connecting plugs 109 and a plurality of dummy plugs 121 are terminated in the top surface of the interlayer insulating film 119. Further, the dummy plug 121 and the second interconnect connecting plug 109 are composed of the same material, and the top surface of the dummy plug 121 and the top surface of the second interconnect connecting plug 109 are terminated in substantially coplanar spatial relationship. More specifically, a plurality of second interconnect connecting plugs and a plurality of the dummy plugs 121 are provided in the same layer, and the top surfaces thereof are positioned to be substantially coplanar.

Here, "the top surface of the second interconnect connecting plug 109 and the top surface of the dummy plug 121 are positioned to be substantially coplanar" is defined as a condition where a step created between the memory unit 104 and the logic unit 102 is sufficiently smaller so that a failure in the formation process such as an insufficient exposure margin shortage in the process for forming the first interconnect layer 123, a generation of a residue of the electrically conductive film serving as the first interconnect 125 and the first interconnect 127 in the CMP process and the like can be inhibited.

The capacitor element 115 is a DRAM cell. An insulating film (silicon nitride (SiN) film 117) is provided between the capacitor element 115 and the dummy plug 121. The dummy plug 121 is provided in a region above a region for forming the capacitor elements 115 in the memory unit 104 and separated from the capacitor element 115 by the SiN film 117. The SiN film 117 functions as an etching stopper in the process for forming the dummy plug 121.

The capacitor element 115 includes a lower electrode 135, an upper electrode 139 and a capacitive film 137 provided between the lower electrode 135 and the upper electrode 139.

The memory unit 104 further includes bit lines 113, and the capacitor elements 115 are provided above the bit lines 113.

In addition, the logic unit 102 further includes interconnects (first interconnects 125) provided so as to contact with the top surfaces of the second interconnect connecting plugs 109, and the material of the dummy plug 121 is different from the material of the first interconnect 125. More specifically, the dummy plug 121 and the second interconnect connecting plug 109 contains a tungsten-containing metal, and the first interconnect 125 contains a copper-containing metal.

The configuration of the semiconductor device 100 will be described in detail as follows.

The semiconductor device 100 is configured to include the silicon substrate 101, the interlayer insulating film 103, the interlayer insulating film 119 and the first interconnect layer 123, which are deposited in this sequence. The semiconductor device 100 includes the logic unit 102 and the memory unit 104, and the interlayer insulating film 103, the interlayer insulating film 119 and the first interconnect layer 123 are formed to extend from the logic unit 102 to the memory unit 104. The same material may be employed for forming the interlayer insulating film composing respective layers, or different materials may be employed.

In the logic unit 102 and in the memory unit 104, transistors (not shown) are provided in the silicon substrate 101, respectively. The transistors provided in the logic unit 102 and the memory unit 104 include the first gate electrode 105 and the second gate electrode 111 provided above the silicon substrate 101, respectively.

In addition, in the first interconnect layer 123, the first interconnect 125 and the first interconnect 127 are embedded in the logic unit 102 and the memory unit 104, respectively.

The logic unit 102 is provided with a plurality of interconnect connecting plugs and the first interconnect layer 123.

Respective interconnect connecting plugs provide electrical coupling between the diffusion layer of the transistor (not shown) and the first interconnect 125. In the embodiment shown in FIG. 1, the interconnect connecting plug is composed of a first interconnect connecting plug 107 and the second interconnect connecting plug 109. The first interconnect connecting plug 107 is provided to contact with the diffusion layer of a transistor (not shown), and is embedded within the interlayer insulating film 103. The second interconnect connecting plug 109 is provided from the interlayer insulating film 103 to the interlayer insulating film 119, and contacts with a top surface of the first interconnect connecting plug 107 and a lower surface of the first interconnect 125.

The memory unit 104 includes a transistor (not shown), a capacitor connecting plug 129, the capacitor element 115, the SiN film 117, the dummy plug 121 and the first interconnect 127.

The capacitor element 115 is embedded in the interlayer insulating film 103. Each of the capacitor elements 115 is configured to include the lower electrode 135, the capacitive film 137 and the upper electrode 139, which are deposited in this sequence. In the present embodiment and in any other embodiments described below, a plurality of capacitor elements 115 are provided in the memory unit 104, and the upper electrode 139 serves as a common electrically conductive film for a plurality of capacitor elements 115. A lower surface of the lower electrode 135 of the capacitor element 115 is located to be coplanar with a lower surface of the second interconnect connecting plug 109.

The SiN film 117 is provided so as to contact with a top surface of the upper electrode 139, and covers the upper electrode 139. A diffusion layer (not shown) of a transistor provided in the memory unit 104 is coupled to the lower electrode 135 of the capacitor element 115 via the capacitor connecting plug 129. The capacitor connecting plug 129 is provided in the same layer that also contains the first interconnect connecting plug 107, and these electroconductive plugs are formed in the same level.

The dummy plug 121 functions as preventing an erosion from being created in the top surface of the interlayer insulating film 119 in the logic unit 102, even if the second interconnect connecting plugs 109 are arranged in a closely packed arrangement in the logic unit 102, thereby reducing a height of the step created in the top surface of the interlayer insulating film 119. In order to exhibiting such function, it is only necessary to provide at least one dummy plug 121, which is terminated in the top surface of the interlayer insulating film 119, above capacitor element 115. A difference in data ratio caused between the logic unit 102 and the memory unit 104 in the top surface of the interlayer insulating film 119 can be reduced by providing at least one dummy plug 121.

Further, in view of further reducing a difference in data ratios caused between the logic unit 102 and the memory unit 104 in the top surface of the interlayer insulating film 119, it is preferable that a data ratio of the logic unit 102 in the top surface of the interlayer insulating film 119 is calculated in advance, and a dummy plug 121 is disposed in the memory unit 104 so as to approaching the real data ratio to the previously calculated data ratio, and it is further preferable that a substantially equivalent data ratios are presented for these data ratios. More specifically, an area occupied by the dummy plug 121 in the memory unit 104 may be provided to be substantially equivalent to an area occupied by the second interconnect connecting plug 109 in the logic unit 102. For example, when the data ratio of the top surface of the interlayer insulating film 119 in the logic unit 102 is 5%, the dummy plug 121 may be provided so as to provide a data ratio of the top surface of the interlayer insulating film 119 in the memory unit 104 of 5±2%. In addition, a data ratio of the dummy plug 121 in the memory unit 104 may be provided to be within a range of from 1% to 10%.

Figure 3A:
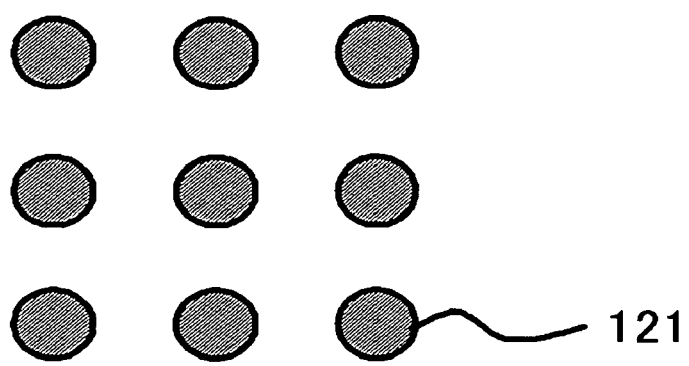
FIGS. 3A to 3C are diagrams, illustrating two-dimensional arrangements of dummy plugs in the semiconductor device of an embodiment.
Figure 3B:
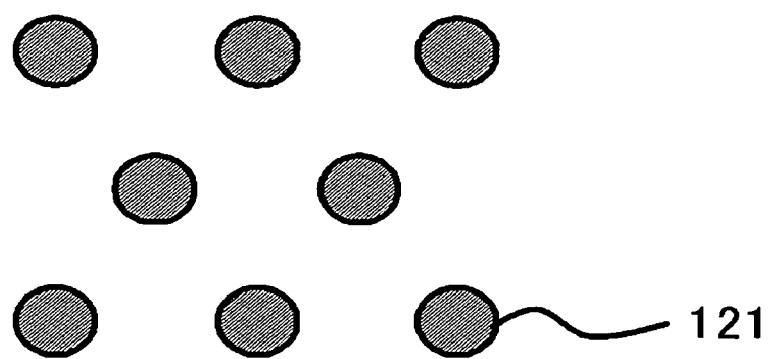
Figure 3C:
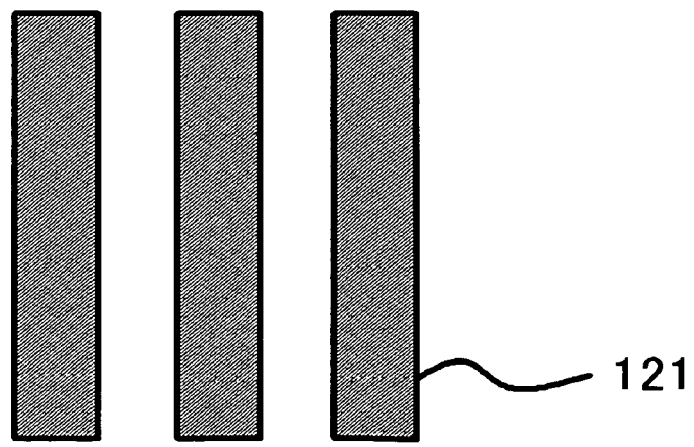

In addition, the two-dimensional geometry of each of the dummy plugs 121 and the two-dimensional arrangement pattern of the dummy plugs 121 are not particularly limited, if an inhibition effect for an erosion in the top surface of the interlayer insulating film 119 can be exhibited, and, for example, a hole shape, a rectangular shape, a line shape or the like may be adopted. More specifically, the two-dimensional geometries and the two-dimensional arrangement patterns shown in FIG. 3A to FIG. 3C may be adopted. FIG. 3A and FIG. 3B illustrate an exemplary implementation of providing a plurality of cylindrical dummy plugs 121. FIG. 3A illustrates an exemplary implementation of arranging the dummy plugs 121 in a tetragonal-lattice pattern. FIG. 3B illustrates an exemplary implementation of arranging the dummy plugs 121 in a stagger pattern (hound's-tooth pattern). By providing a cylindrical geometry for the dummy plug 121, the formation of the dummy plugs 121 can be further facilitated in the same operation for forming the second interconnect connecting plug 109. FIG. 3C illustrates an exemplary implementation of arranging a plurality of bar-shaped dummy plugs 121 in parallel to form a stripe pattern. Since data ratio of the memory unit 104 can be more surely enhanced by arranging the plugs in the pattern as shown in FIG. 3C, a creation of the step in the top surface of the interlayer insulating film 119 can be inhibited, even if the data ratio of the logic unit 102 is higher.

In addition, a diameter (width) of the dummy plug 121 in a cross-sectional view may be configured to be, for example, substantially equal to a diameter of the second interconnect connecting plug 109, or larger than a diameter of the second interconnect connecting plug 109. A creation of a step in the top surface of the interlayer insulating film 119 can be effectively inhibited by employing minimum number of dummy plugs 121, by providing a larger diameter (width) of the dummy plug 121 as compared with the diameter of the second interconnect connecting plug 109 as in the case illustrated in FIG. 1. A degree of structural flexibility in the upper layer of the dummy plug 121 can be increased by reducing number of the dummy plugs 121. In addition, a failure in the patterning process in the photolithographic process can be prevented.

In addition, while the configuration, in which all of a plurality of dummy plugs 121 are provided right under the first interconnect 127 so as to contact therewith, is illustrated in FIG. 1, the relative spatial relationship between the first interconnect 127 and the dummy plug 121 is not limited to the configuration illustrated in FIG. 1, provided that a short-circuit of the first interconnect 127 through the dummy plug 121 is prevented. Further, an alternative configuration of disposing the dummy plug 121 between the first interconnect 127 and the first interconnect 127 and providing an electrical insulation among the first interconnect 127, the dummy plug 121 and the upper electrode 139 may also be employed.

A process for manufacturing the semiconductor device 100 will be described as follows. This process is a process for manufacturing a semiconductor that includes the memory unit 104 and the logic unit 102, and the process comprises the following operations of:

(i) forming a capacitor element 115 above a device-forming surface of the silicon substrate 101;

(ii) forming the interlayer insulating film 103 and the interlayer insulating film 119 above the silicon substrate 101 after the operation of forming the capacitor element 115, the interlayer insulating film 103 and the interlayer insulating film 119 extending from a region for forming the memory unit 104 to a region for forming the logic unit 102 and covering a top surface of the capacitor element 115; and (iii) simultaneously forming the second interconnect connecting plug 109 and the dummy plug 121 in the logic unit 102 and the memory unit 104, respectively, after the operation of forming these insulating layers, including: selectively removing portions of the interlayer insulating film 103 and the interlayer insulating film 119 in a predetermined region of the logic unit 102 and predetermined region of the memory unit 104 to form a first concave portion and a second concave portion in the logic unit 102 and the memory unit 104, respectively;

forming an electrically conductive film to fill the first concave portion and the second concave portion therewith; and removing portions of the electrically conductive film formed outside of the first concave portion and outside of the second concave portion.

In the operation (iii) for simultaneously forming the second interconnect connecting plug 109 and the dummy plug 121, the bottom surface of the second concave portion is provided to be separated from the top surface of the capacitor element 115. Further, the operation (iii) for simultaneously forming the second interconnect connecting plug 109 and the dummy plug 121 includes forming the dummy plug 121 so as to contact with the top surface of the SiN film 117.

The process for manufacturing the semiconductor device 100 further includes:

(iv) forming the SiN film 117 above the capacitor element 115 in the memory unit 104, before simultaneously forming the second interconnect connecting plug 109 and the dummy plug 121; and (v) forming the first interconnect 125 to be connected to the second interconnect connecting plug 109 in the logic unit 102 and forming the first interconnect 127 in the memory unit 104. In case of the semiconductor device 100, the first interconnect 127 to be connected to the dummy contact plug 121 is formed in the memory unit 104 in the operation (v).

FIG. 4A to FIG. 4C, FIG. 5A to FIG. 5C and FIG. 6 are cross-sectional views of the semiconductor device 100, illustrating a process for manufacturing the semiconductor device 100. The process for manufacturing the semiconductor device 100 will be more specifically described as follows, in reference to these figures.

Figure 4A:
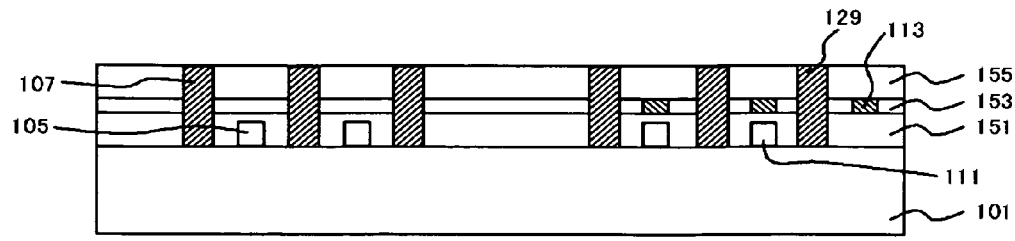
FIGS. 4A to 4C are cross-sectional views of a semiconductor device, illustrating a process for manufacturing the semiconductor device of FIG. 1.

First of all, as shown in FIG. 4A, a diffusion layer (not shown), the first gate electrode 105, the second gate electrode 111 and the like are formed in a predetermined region of the silicon substrate 101 to form a transistor (not shown) in the logic unit 102 and a transistor composing a memory element (DRAM) in the memory unit 104. Materials for the first gate electrode 105 and for the second gate electrode 111 may be, for example, polycrystalline silicon. Next, an interlayer insulating film 151 and an interlayer insulating film 153 are formed in this sequence on the entire upper surface of the silicon substrate 101. Predetermined regions of the interlayer insulating film 153 is selectively removed to form a trench-shaped concave portion. A barrier metal film such as, for example, a titanium nitride (TiN) film and the like, and a tungsten (W) film, which serve as electrically conductive film for forming the bit lines 113, are sequentially deposited so as to fill the trench-shaped concave portion therewith, and then portions of the electrically conductive film formed outside of the concave portion are removed to form the bit lines 113, which is embedded in the interlayer insulating film 153. Alternatively, the bit line 113 may be formed by depositing TiN and W on the interlayer insulating film 151 via a sputter process and then carrying out a known photolithographic process and a dry etch process.

Then, an interlayer insulating film 155 is deposited on and to contact with the interlayer insulating film 153, and then, column-shaped concave portions extending through the interlayer insulating film 155, the interlayer insulating film 153 and the interlayer insulating film 151 are formed in predetermined regions of the logic unit 102 and the memory unit 104. The diffusion layers of the transistors formed in the logic unit 102 and the memory unit 104 are exposed, respectively, from the bottoms of the concave portions. A barrier metal film and a W film, which serve as an electrically conductive film for forming the first interconnect connecting plug 107 and the capacitor connecting plug 129, are sequentially deposited so as to fill the column-shaped concave portions, and then portions of the electrically conductive film formed outside of the concave portions are removed, so that a plurality of first interconnect connecting plugs 107 and a plurality of capacitor connecting plugs 129, both of which are composed of the same material, are simultaneously formed in the same layer to provide a coplanar relationship therebetween.

Figure 4B:
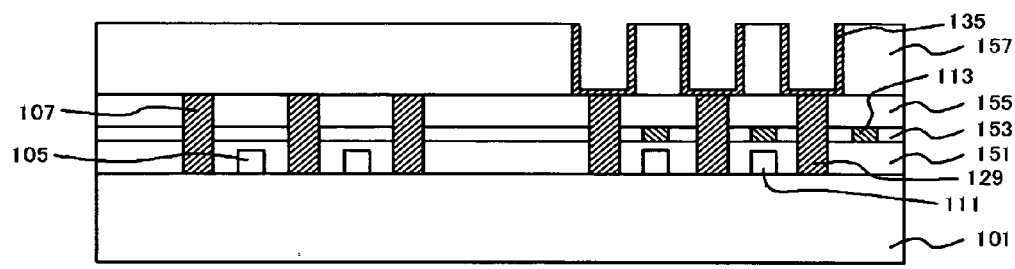

Subsequently, the interlayer insulating film 157 are deposited on the entire upper surface of the interlayer insulating film 155, and the upper regions of respective capacitor connecting plugs 129 are selectively removed to form column-shaped concave portions, and then, a TiN film for serving as an electrically conductive film composing the lower electrode 135, for example, is formed on the entire upper surface of the interlayer insulating film 157. Then, a resist film (not shown) is formed on the entire upper surface of the interlayer insulating film 157 and patterned. In this case, an exposure condition is selected to selectively remain portions of the resist film in the regions inside of the concave portions. Then, an etchback process for the entire surface of the TiN film through a mask of the resist film is conducted to remove the portions of the TiN film formed in regions except the interior wall of the concave portion, thereby obtaining a plurality of lower electrodes 135 that composes respective capacitor elements 115 (FIG. 4B).

Figure 4C:
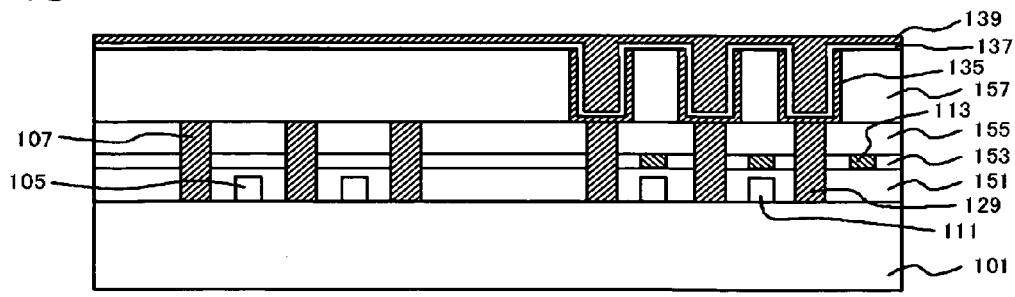
Figure 5A:
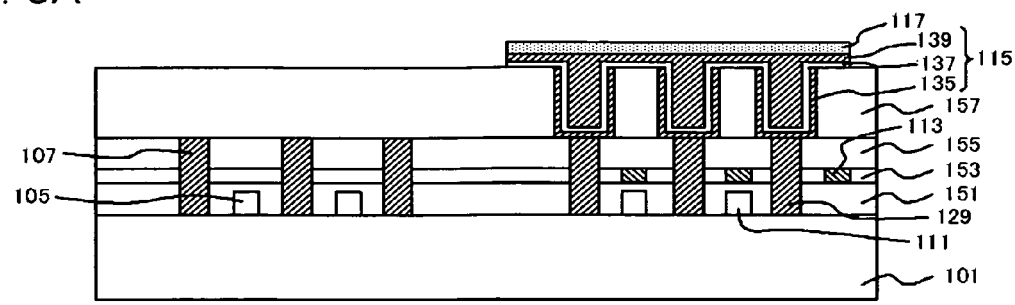
FIGS. 5A to 5C are cross-sectional views of the semiconductor device, illustrating the process for manufacturing the semiconductor device of FIG. 1.

Then, an insulating film serving as the capacitive film 137 and a TiN film and a W film serving as the upper electrode 139 are sequentially formed on the entire upper surface of the interlayer insulating film 157 (FIG. 4C). The capacitive film 137 is formed so as to cover the exposed surfaces of the lower electrode 135 and fill portions of the concave portions. Silicon nitride (SiN), for example, is employed for a material of the capacitive film 137. Alternatively, a material for forming a high dielectric constant film (high-k film) such as hafnium oxide ($HfO_2$), zirconium oxide ($ZrO_2$) and the like may be employed. A deposition of the capacitive film 137 may be conducted via, for example, a CVD process, an atomic layer deposition (ALD) process and the like. Further, a thickness of the capacitive film 137 may be appropriately selected according to a capacity of the capacitor element 115, and, for example may be within a range of from 1 nm to 100 nm. Further, the SiN film 117 is deposited on the entire upper surface of the upper electrode 139 via a plasma CVD process, and then, portions of the SiN film 117, the upper electrode 139 and the lower electrode 135, which are formed in regions except the regions for forming the capacitor elements 115, are selectively removed to obtain a plurality of cylinder-shaped capacitor elements 115 that commonly have the upper electrode 139 (FIG. 5A). Concerning the capacitor element 115, the concave portion is plugged with the upper electrode 139, and a plurality of capacitor elements 115 are provided to form a continuous integral body.

Figure 5B:
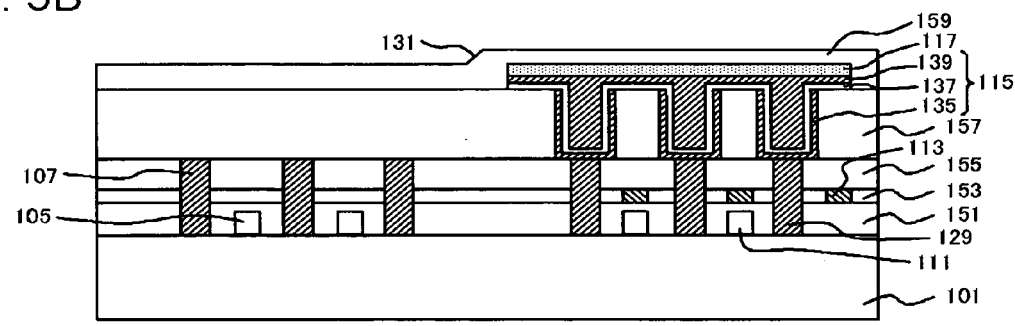
Figure 5C:
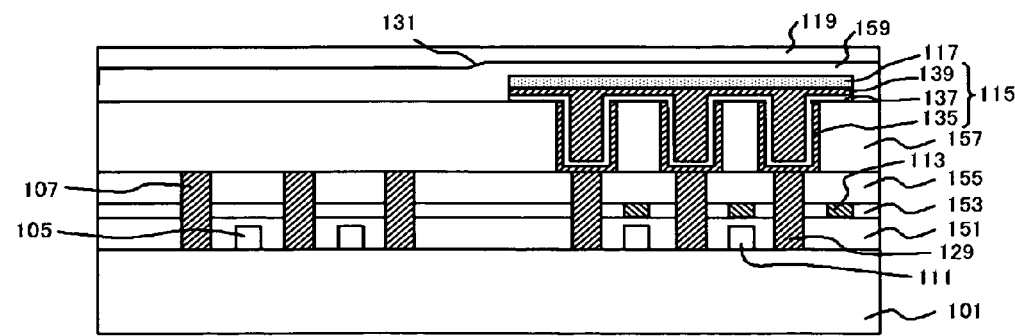

Then, a silicon oxide ($SiO_2$) film serving as the interlayer insulating film 159 is formed on the entire upper surface of the interlayer insulating film 157. Since only the memory unit 104 is provided with the capacitor elements 115 and the SiN film 117 in this case, a step 131 is created between the memory unit 104 and the logic unit 102 (FIG. 5B). The height of the step 131 can be reduced to a height that does not adversely affect the formation of the upper layer by a chemical mechanical polishing (CMP) process for the interlayer insulating film 159 (FIG. 5C). In addition to above, a multiple-layered member composed of the interlayer insulating film 151, the interlayer insulating film 153, the interlayer insulating film 155, the interlayer insulating film 157 and the interlayer insulating film 159 corresponds to the interlayer insulating film 103 shown in FIG. 1. Materials for the respective insulating films composing the interlayer insulating film 103 may be, for example, $SiO_2$. Alternatively, low dielectric constant interlayer insulating films may be formed as respective interlayer insulating films. More specifically, a $SiO_2$ film having a ladder structure may be deposited via a coating process. Alternatively, a silicon oxycarbide (SiOC) film may be deposited via a plasma CVD process, an then an $SiO_2$ film may be deposited on the top surface of the low dielectric constant interlayer insulating film to form a multi-layered film.

Thereafter, an $SiO_2$ film serving as the interlayer insulating film 119 is formed on the entire upper surface of the interlayer insulating film 159 (FIG. 5C). Then, predetermined regions of the logic unit 102 and the memory unit 104 are selectively removed to form column-shaped concave portions. In this case, in the logic unit 102, concave portions extending through the interlayer insulating film 119, the interlayer insulating film 159 and the interlayer insulating film 157 are formed. The bottom surfaces of the concave portions are the exposed surfaces of the first interconnect connecting plugs 107. On the other hand, in the memory unit 104, since the SiN film 117 is formed therein, the concave portions are terminated at the top surface of the SiN film 117. Then, a barrier metal film and a W film, which serve as electrically conductive films composing the second interconnect connecting plug 109 and the dummy plug 121, are sequentially formed on the entire upper surface of the interlayer insulating film 119, and portions of the electrically conductive film formed outside of the concave portion are removed by the CMP process.

Figure 6:
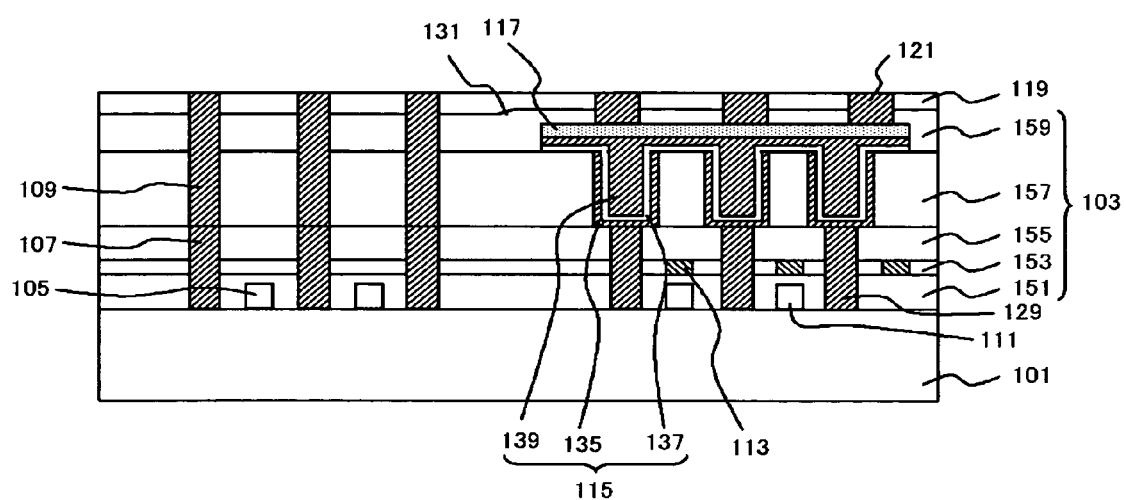
FIG. 6 is a cross-sectional view of the semiconductor device, illustrating the process for manufacturing the semiconductor device of FIG. 1.

Here, since memory unit 104 is also provided with concave portions in the present embodiment, a reduced difference in data ratios between the logic unit 102 and the memory unit 104 in the top surface of the interlayer insulating film 119 is achieved. Consequently, a creation of a step between the memory unit 104 and the logic unit 102 by the above-described CMP process can be inhibited. Thus, a sufficient flatness in the top surface of the interlayer insulating film 119 can be ensured, and a plurality of second interconnect connecting plugs 109 and a plurality of dummy plugs 121, the top surfaces of both of which are substantially coplanar, can be simultaneously formed in one process (FIG. 6).

Then, the first interconnect layer 123 is formed on the entire upper surface of the interlayer insulating film 119, and the first interconnect 125 to be connected to the second interconnect connecting plug 109 and the first interconnect 127 to be connected to the dummy plug 121 are simultaneously formed in predetermined regions in the first interconnect layer 123. The semiconductor device 100 shown in FIG. 1 is obtained by the above-described procedure.

Next, advantageous effects obtainable by employing the configuration of the present embodiment will be described.

In the semiconductor device 100, the dummy plugs 121 are provided above the capacitor elements 115. Further, the dummy plugs 121 and a plurality of second interconnect connecting plugs 109 are terminated at the top surface of the interlayer insulating film 119. Further, the dummy plugs 121 and the second interconnect connecting plugs 109 are composed of the same material, and the top surfaces of the dummy plugs 121 and the top surfaces of the second interconnect connecting plugs 109 are terminated in substantially coplanar spatial relationship. As such, the dummy plugs 121 terminated at the top surface of the interlayer insulating film 119 are also provided in the memory unit 104, so that a difference in data ratio of the top surfaces of the interlayer insulating film 119 caused between the logic unit 102 and the memory unit 104 can be reduced.

Thus, even if the intervals between the second interconnect connecting plugs 109 are reduced, a generation of an erosion in the top surface of the interlayer insulating film 119 in the side of the logic unit 102 can be inhibited during the CMP process for forming the second interconnect connecting plugs 109. Consequently, a creation of a step in the top surface of the interlayer insulating film 119 provided between the semiconductor substrate 101 and the first interconnect layer 123 can be inhibited. According to investigations conducted by the present inventor, an influence of an erosion created in the top surface of the interlayer insulating film 119 is considerable in a configuration having intervals between the second interconnect connecting plugs 109 of, for example, equal to or shorter than 90 nm, and even in the case of having such configuration, a generation of a step in the top surface of the interlayer insulating film 119 can be effectively inhibited by providing the dummy plugs 121. Consequently, for example, an improved exposure margin in an exposure process for exposing the first interconnect layer, or a prevention of polishing remainder of a Cu film composing the first interconnect 125 and the first interconnect 127 can be achieved. Thus, a defective situation created in the process for forming the interconnect in the first interconnect layer 123 formed in the upper layer of the interlayer insulating film 119 can be inhibited, thereby providing an improved throughput.

In addition, since the embedded COB DRAM device having the capacitor elements 115 disposed above the bit lines 113 are not configured to have a bit contact plug that extends to a region above the capacitor element 115, a difference in data ratio in the region above the capacitor element 115 is particularly increased. According to the present embodiment, even if the COB structure is adopted, a generation of a step in the top surface of the interlayer insulating film 119 can be reduced by providing the dummy plugs 121. Consequently, for example, an improved exposure margin in an exposure process for exposing the first interconnect layer, or a prevention of polishing remainder of a Cu film composing the first interconnect 125 and the first interconnect 127 can be achieved. Thus, even in the case of the embedded COB DRAM device, a defective situation created in the process for forming the first interconnect layer 123 can be inhibited, thereby providing an improved throughput.

Figure 15:
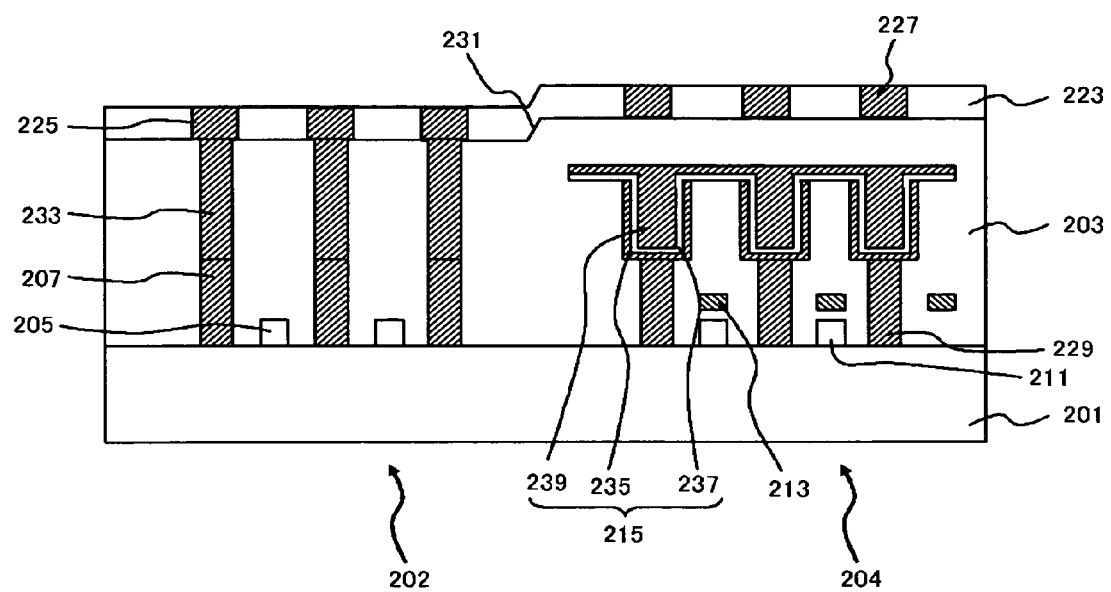
FIG. 15 is a cross-sectional view, schematically illustrating a configuration of a semiconductor device.
Figure 16A:
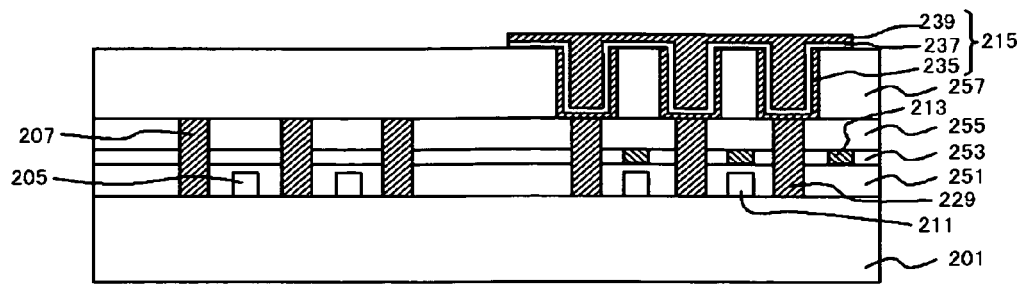
FIGS. 16A to 16C are cross-sectional views of a semiconductor device, illustrating a process for manufacturing the semiconductor device of FIG. 15.
Figure 16B:
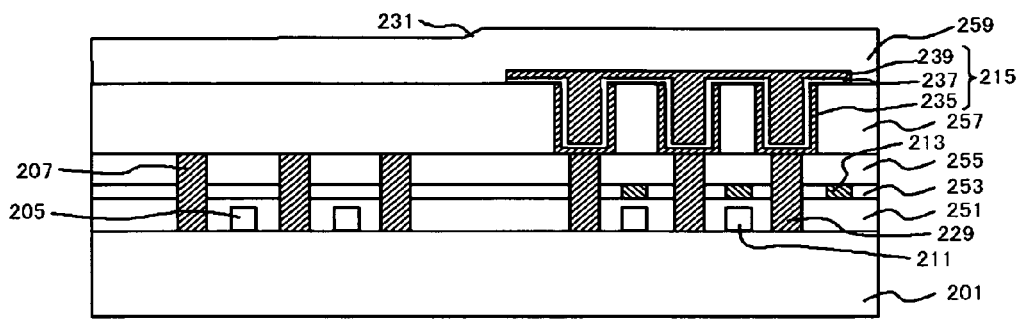
Figure 16C:
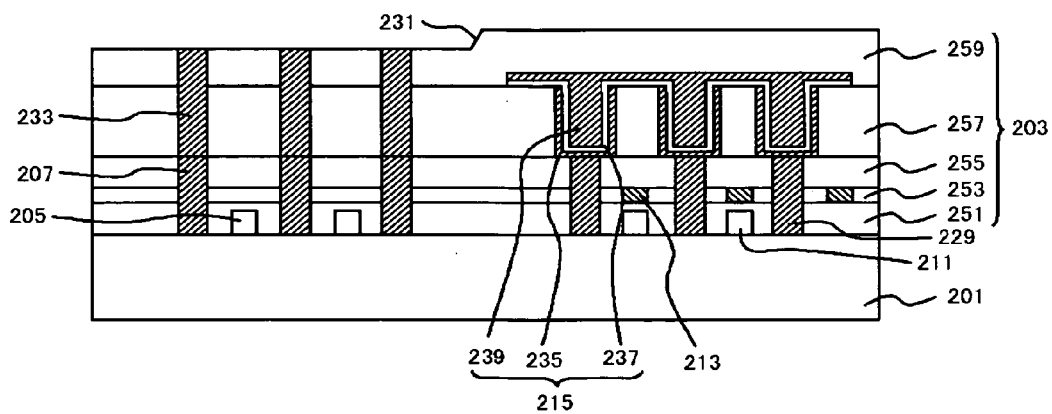

Further description on the semiconductor device 100 of the present embodiment will be made as follows, by presenting comparisons with a semiconductor device including no dummy plug 121. FIG. 15 is a cross-sectional view, illustrating a configuration of a semiconductor device which includes no dummy plug 121. FIG. 16A to FIG. 16C are cross-sectional views, illustrating a process for manufacturing a semiconductor device 200 shown in FIG. 15.

The configuration of the semiconductor device 200 is similar to that of the semiconductor device 100 shown in FIG. 1, except that the device does not include the dummy plug 121, the SiN film 117 and the interlayer insulating film 119. In addition, a second interconnect connecting plug 233 for providing a coupling between a first interconnect connecting plug 207 and a first interconnect 225 is terminated at a top surface of an interlayer insulating film 203, and thus a step is created in the top surface of the interlayer insulating film 203 between the logic unit 202 and the memory unit 204 in the interlayer insulating film 203. Consequently, the step is created in the first interconnect layer 223.

The semiconductor device 200 is produced by the following procedure.

First of all, as shown in FIG. 16A, a diffusion layer (not shown), the first gate electrode 205, the second gate electrode 211 and the like are formed in a predetermined region of the silicon substrate 201 to form a transistor (not shown) in the logic unit 202 and a transistor composing a memory element (DRAM) in the memory unit 204. Next, an interlayer insulating film 251 and an interlayer insulating film 253 are formed in this sequence on the entire upper surface of the silicon substrate 201. Predetermined regions of the interlayer insulating film 253 is selectively removed to form a trench-shaped concave portion. A barrier metal film and a tungsten (W) film, for example, which serve as electrically conductive film for forming the bit lines 213, are sequentially deposited so as to fill the trench-shaped concave portion therewith, and then portions of the electrically conductive film formed outside of the concave portion are removed to form the bit lines 213, which are embedded in the interlayer insulating film 253. Alternatively, the bit lines 213 may be formed by depositing TiN and W on the interlayer insulating film 251 via a sputter process and then carrying out a known photolithographic process and a dry etch process.

Then, an interlayer insulating film 255 is deposited on and to contact with the interlayer insulating film 253, and then, column-shaped concave portions extending through the interlayer insulating film 255, the interlayer insulating film 253 and the interlayer insulating film 251 are formed in predetermined regions of the logic unit 202 and the memory unit 204. The diffusion layers of the transistors formed in the logic unit 202 and the memory unit 204 are exposed, respectively, from the bottoms of the concave portions. A barrier metal film and a W film, which serve as an electrically conductive film for forming the first interconnect connecting plug 207 and the capacitor connecting plug 229, are sequentially deposited so as to fill the column-shaped concave portions, and then portions of the electrically conductive film formed outside of the concave portions are removed, so that a plurality of first interconnect connecting plugs 207 and a plurality of capacitor connecting plugs 229, both of which are composed of the same material, are simultaneously formed to provide a coplanar relationship therebetween.

Subsequently, the interlayer insulating film 257 are deposited on the entire upper surface of the interlayer insulating film 255, and the upper regions of respective capacitor connecting plugs 229 are selectively removed to form column-shaped concave portions, and then, a TiN film for serving as an electrically conductive film composing the lower electrode 235, for example, is formed on the entire upper surface of the interlayer insulating film 257. Then, a resist film (not shown) is formed on the entire upper surface of the interlayer insulating film 257 and the formed resist film is patterned. In this case, portions of the resist film in the regions inside of the concave portions are selectively remained by suitably selecting an exposure condition. Then, an etchback process for the entire surface of the TiN film through a mask of the resist film is conducted to remove the portions of the TiN film formed in regions except the interior wall of the concave portion, thereby obtaining a plurality of lower electrodes 235 that composes respective capacitor elements 215.

Then, an insulating film serving as the capacitive film 237 and a TiN film and a W film serving as the upper electrode 239 are sequentially formed on the entire upper surface of the interlayer insulating film 257. The capacitive film 237 is formed so as to cover the exposed surfaces of the lower electrode 235 and fill portions of the concave portions therewith. Further, portions of the upper electrode 139 and the lower electrode 235, which are formed in regions except the regions for forming the capacitor elements 215, are selectively removed to obtain a plurality of cylinder-shaped capacitor elements 215 that commonly have the upper electrode 239 (FIG. 16A). Concerning the capacitor element 215, the concave portion is plugged with the upper electrode 239, and a plurality of capacitor elements 215 are provided to form a continuous integral body.

Then, an $SiO_2$ film serving as the interlayer insulating film 259 is formed on the entire upper surface of the interlayer insulating film 257. Although a step 231 is created between the memory unit 104 and the logic unit 102 since only the memory unit 204 is provided with the capacitor element 215 in this case, the height of the step 231 can be reduced to a height that does not adversely affect the formation of the upper layer by a chemical mechanical polishing (CMP) process for the interlayer insulating film 259 (FIG. 16B). In addition to above, a multiple-layered member composed of the interlayer insulating film 251, the interlayer insulating film 253, the interlayer insulating film 255, the interlayer insulating film 257 and the interlayer insulating film 259 corresponds to the interlayer insulating film 203 shown in FIG. 15.

Further, predetermined regions of the logic unit 202 are selectively removed to form column-shaped concave portions extending through the interlayer insulating film 259 and the interlayer insulating film 257. The bottom surfaces of the concave portions are the exposed surfaces of the first interconnect connecting plugs 207. Then, a barrier metal film and a W film, which serve as electrically conductive films composing the second interconnect connecting plug 233, are sequentially formed on the entire upper surface of the interlayer insulating film 259, and portions of the electrically conductive film formed outside of the concave portion are removed by the CMP process. An erosion due to reduced intervals between the second interconnect connecting plugs 233 is caused in this CMP process, the height of the step 231 in the top surface of the interlayer insulating film 259 caused between the logic unit 202 and the memory unit 204 is considerably increased (FIG. 16C).

Thereafter, the first interconnect layer 223 is formed on the entire upper surface of the interlayer insulating film 259, and the first interconnect 225 to be connected to the second interconnect connecting plug 233 and the first interconnect 227 are simultaneously formed in predetermined regions in the first interconnect layer 223. The semiconductor device 200 shown in FIG. 15 is obtained by the above-described procedure. In case of employing this procedure, an influence of the step 231 generated in the top surface of the interlayer insulating film 259 cannot be ignored, and a failure in the interconnect in the first interconnect layer 223 during the formation process may be generated. For example, an insufficient exposure margin in the formation of the interconnect in the first interconnect layer 223 or a generation of a residual Cu due to an insufficient control of the CMP for the Cu film that composes the first interconnect may be caused.

On the contrary, in the semiconductor device 100 according to the present invention, the dummy plug 121 is provided above the capacitor elements 115, and data ratios in the top surface of interlayer insulating film 119 in the logic unit 102 and in the memory unit 104 are harmonized, so that a creation of a step in the top surface of the interlayer insulating film 119 created between the logic unit 102 and the memory unit 104 can be inhibited, even though an erosion is caused in the top surface of the interlayer insulating film 119 in the memory unit 104 due to a reduced intervals between the second interconnect connecting plugs 109.

In addition to above, while exemplary implementations concerning the semiconductor device 100 and other embodiments are described, in which the interlayer insulating film 159 is provided on the top surface of the interlayer insulating film 157 after forming the capacitor elements 115 and then the interlayer insulating film 119 is formed thereon (FIG. 5B), a formation of either one of the interlayer insulating film 119 and the interlayer insulating film 159 may not be conducted. For example, when the interlayer insulating film 159 is not provided, the interlayer insulating film 119 is formed on the top surface of the interlayer insulating film 157 after forming the capacitor elements 115. In this case, the top surface of the interlayer insulating film 119 is planarized via a CMP process for the interlayer insulating film 119 so that a failure of the upper layer during the manufacturing process is not occurred. Then, the process described above in reference to FIG. 6 may be employed to simultaneously form the second interconnect connecting plugs 109 and the dummy plugs 121. In this case, a creation of a step in the top surface of the interlayer insulating film 119 can also be inhibited.

In addition, in the configuration where the dummy plugs 121 are disposed above the capacitor elements 115, when the dummy plug 121 directly contacts with the upper electrode 139, additionally emerging problems such as that an electrical conduction and a short-circuit therebetween or an increased parasitic capacitance between the capacitor element 115 and the first interconnect 125 may be created.

Therefore, in the present embodiment, the top surface of the upper electrode 139 is covered with a hard mask composed of the SiN film 117 to ensure providing an electrical insulation between the upper electrodes 139 and the dummy plugs 121. In addition, SiN is employed for a material of the coating film provided on the upper electrode 139, and $SiO_2$ is employed for a material of the interlayer insulating film 103 (interlayer insulating film 157), such that the coating film provided on the upper electrode 139 can be utilized as an etching stopper film in the process for forming the dummy plugs 121, providing further ensured inhibition in an electrical conduction between the dummy plug 121 and the upper electrode 139.

Figure 7:
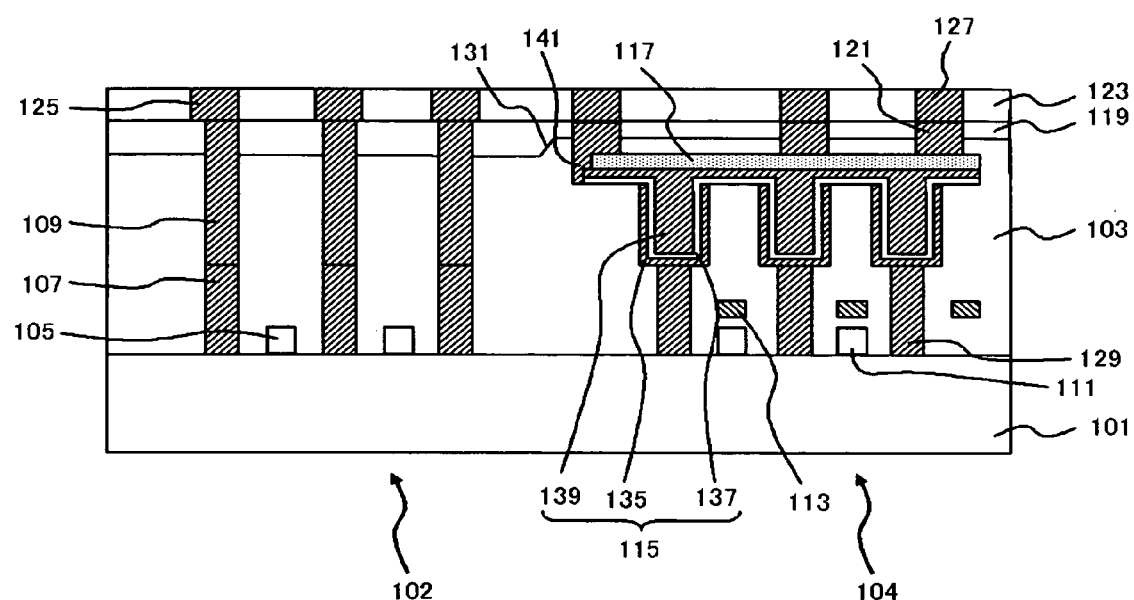
FIG. 7 is a cross-sectional view of the semiconductor device, illustrating the process for manufacturing the semiconductor device of FIG. 1.

In addition to above, in the present embodiment, an arrangement of the electro conductive plugs for coupling the upper electrode 139 with the first interconnect 127 may be designed as follows. FIG. 7 is a cross-sectional view, illustrating another configuration of the semiconductor device 100.

While the configuration of providing the SiN film 117 on the entire upper surface of the upper electrode 139 is illustrated in FIG. 1, the upper electrode 139 may include an exposed portion that is not coated with the SiN film 117 provided in vicinity of the end of the memory unit 104, and an electroconductive upper electrode connecting plug 141 connecting the first interconnect 127 to the upper electrode 139 may be provided in the exposed portion, as shown in FIG. 7. The upper electrode connecting plug 141 is in contact with the upper electrode 139 from the top surface of the upper electrode 139 to the side surface thereof. This can ensure coupling the upper electrode 139 to the upper layer. In addition, the upper electrode connecting plug 141 can be selectively disposed in vicinity of a circumference of a region for forming the capacitor element 115, so that a degree of integration of the capacitor elements 115 within the memory unit 104 can be sufficiently assured.

Figure 8A:
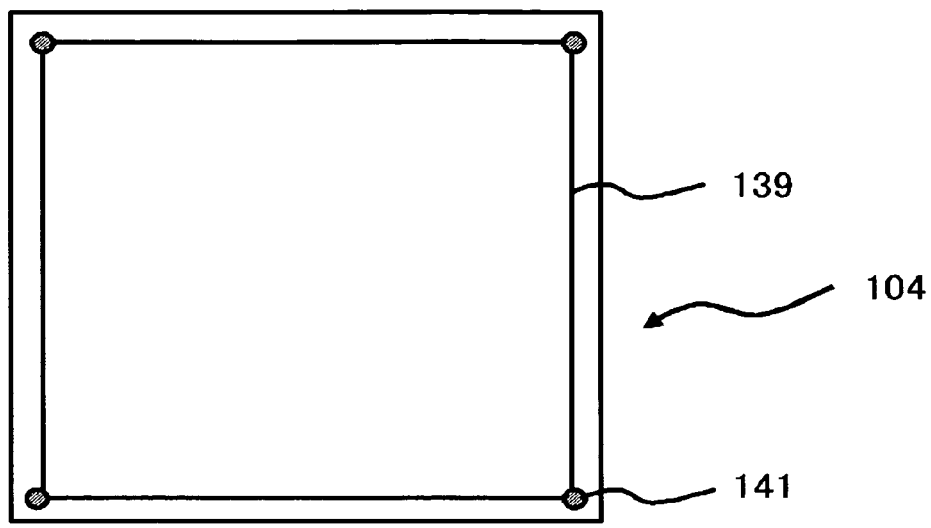
FIGS. 8A and 8B are diagrams, illustrating two-dimensional arrangements of upper electrode connecting plugs in the semiconductor device of an embodiment.
Figure 8B:
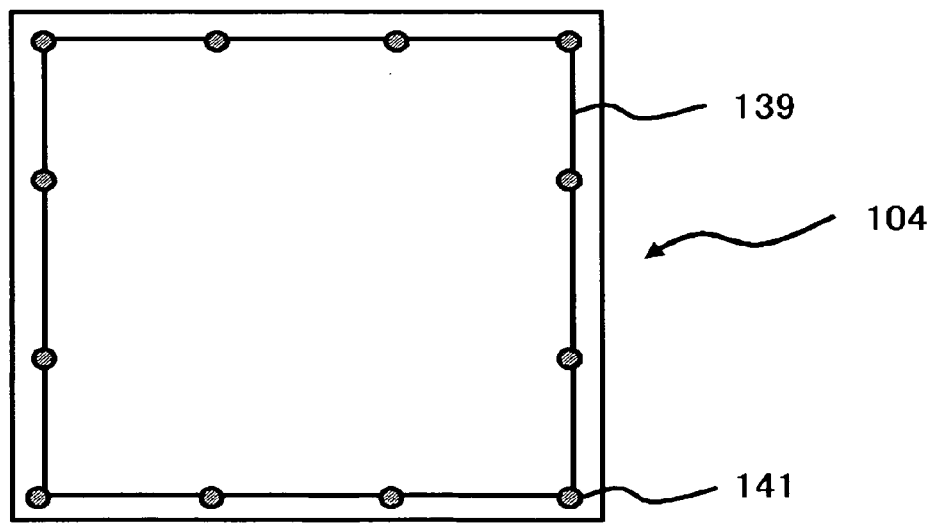

FIG. 8A and FIG. 8B are plan views, illustrating an exemplary implementation of a two-dimensional arrangement of the upper electrode connecting plugs 141. FIG. 8A shows an arrangement, in which two-dimensional geometry of a region for forming the memory unit 104 and the upper electrode 139 is rectangular and the upper electrode connecting plugs 141 are disposed in the respective four corners. FIG. 8B shows an arrangement, in which the upper electrode connecting plugs 141 are disposed with predetermined intervals in vicinity of the circumference of the region for forming the upper electrode 139. The configuration shown in FIG. 8B is employed to further ensure coupling a plurality of capacitor elements 115 to the first interconnect 127.

In the following embodiments, differences from the first embodiment will be mainly described.

Second Embodiment

Figure 9:
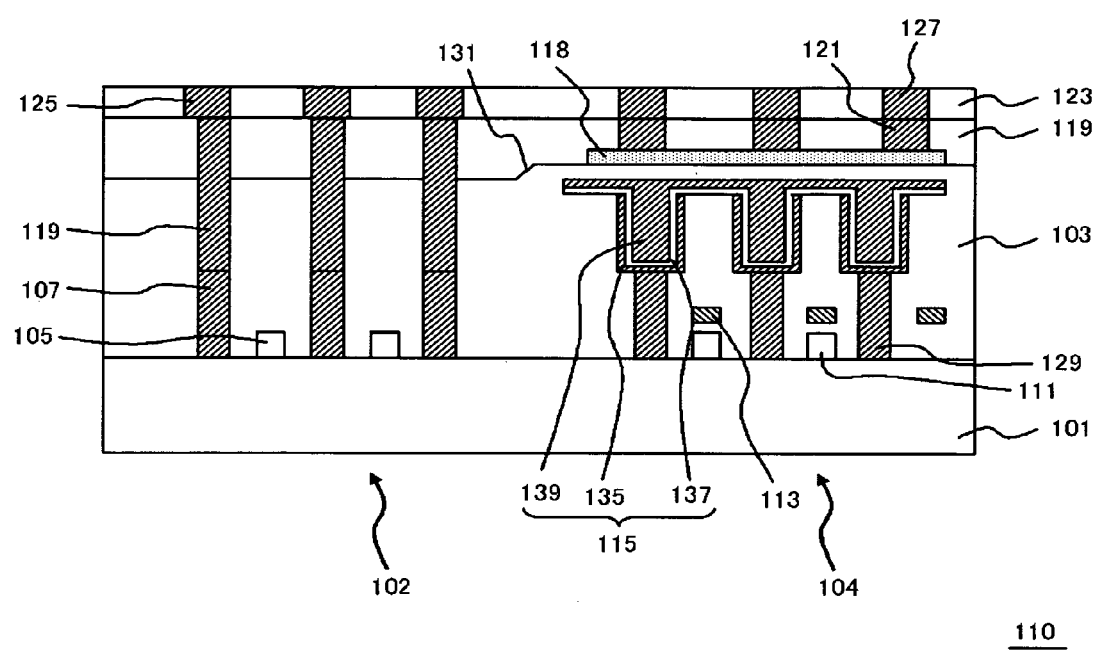
FIG. 9 is a cross-sectional view, schematically illustrating a configuration of a semiconductor device according to an embodiment.

FIG. 9 is a cross-sectional view, illustrating a configuration of a semiconductor device of the present embodiment. A semiconductor device 110 includes an SiN film 118 provided separately from the capacitor elements 115, in place of the SiN film 117 of the semiconductor device 100 shown in FIG. 1.

Figure 12:
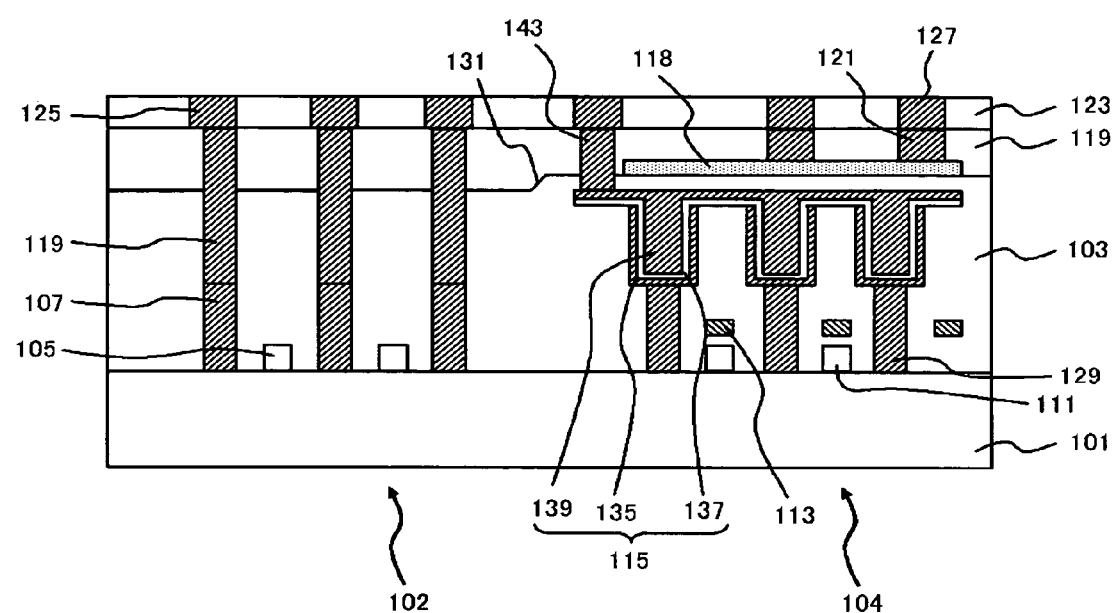
FIG. 12 is a cross-sectional view, schematically illustrating a configuration of a semiconductor device according to an embodiment.

In addition, the semiconductor device 110 further includes an electroconductive upper electrode connecting plug 143 which is provided to be remote from the SiN film 118, and connected to the upper electrode 139 in the lower surface thereof (FIG. 12).

The semiconductor device 110 is manufactured in the following procedure. FIG. 10A to FIG. 10C and FIG. 11 are cross-sectional views, illustrating a process for manufacturing the semiconductor device 110.

Figure 10A:
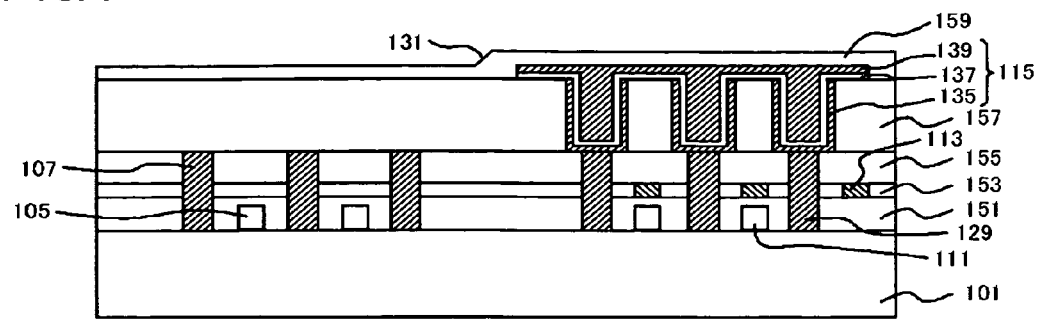
FIGS. 10A to 10C are cross-sectional views of a semiconductor device, illustrating a process for manufacturing the semiconductor device of FIG. 9.

First of all, the part of the manufacturing process until the upper electrode 139 is formed is conducted by employing the procedure described above in reference to FIG. 4A to FIG. 4C (FIG. 4C). Then, portions of the upper electrode 139 and the capacitive film 137 formed in other regions except the region for forming the capacitor elements 115 are selectively removed to form a plurality of capacitor elements 115, each of which has the upper electrode 139 as a common member. Then, the interlayer insulating film 159 is formed in the entire upper surface of the interlayer insulating film 157 (FIG. 10A). Since only the memory unit 104 is provided with the capacitor elements 115 in this case, a step 131 is created between the memory unit 104 and the logic unit 102. The height of the step 131 can be reduced to a height that does not adversely affect the formation of the upper layer by a chemical mechanical polishing (CMP) process for the interlayer insulating film 159 (FIG. 10B).

Figure 10B:
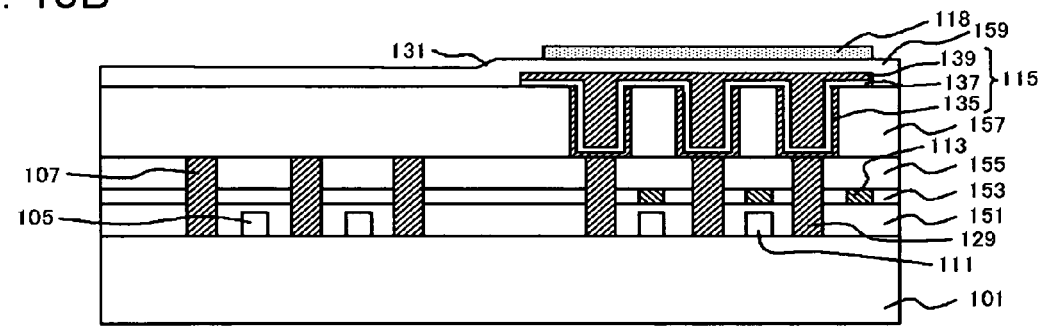
Figure 10C:
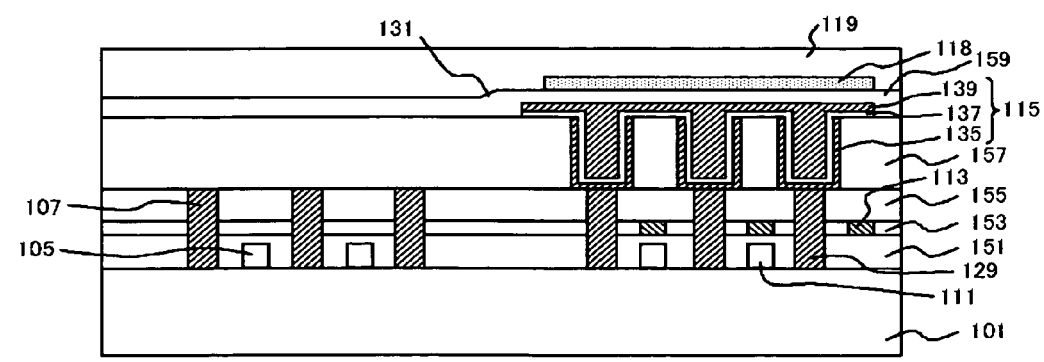

Next, in regions except a predetermined region of the memory unit 104, the SiN film 118 is formed on the entire upper surface of the interlayer insulating film 159 (FIG. 10B). Then, the interlayer insulating film 119 is formed on the entire upper surface of the interlayer insulating film 159 (FIG. 10C). Then, predetermined regions of the logic unit 102 and the memory unit 104 are selectively removed to form column-shaped concave portions. In this case, in the logic unit 102, concave portions extending through the interlayer insulating film 119, the interlayer insulating film 159 and the interlayer insulating film 157 are formed. The bottom surfaces of the concave portions are the exposed surfaces of the first interconnect connecting plugs 107. On the other hand, in the memory unit 104, since the SiN film 118 is formed therein, the concave portions are terminated at the top surface of the SiN film 118.

Figure 11:
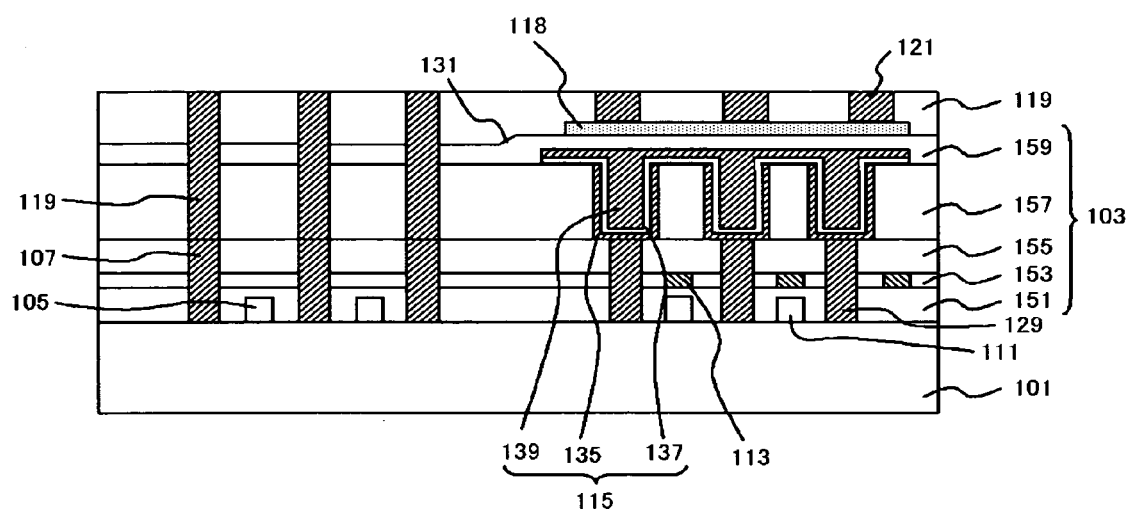
FIG. 11 is a cross-sectional views of the semiconductor device, illustrating the process for manufacturing the semiconductor device of FIG. 9.

Subsequently, a barrier metal film and a W film, which serve as electrically conductive films composing the second interconnect connecting plug 109 and the dummy plug 121, are sequentially formed on the entire upper surface of the interlayer insulating film 119, and portions of the electrically conductive film formed outside of the concave portion are removed by the CMP process. Since memory unit 104 is also provided with concave portions in this CMP process, a reduced difference in data ratios between the logic unit 102 and the memory unit 104 in the top surface of the interlayer insulating film 119 is achieved. Consequently, a flatness of the top surface of the interlayer insulating film 119 after the CMP process is sufficiently ensured, and thus a creation of a step between the memory unit 104 and the logic unit 102 can be inhibited. Having such procedure, a plurality of second interconnect connecting plugs 109 and a plurality of dummy plugs 121, the top surfaces of both of which are substantially coplanar, can be simultaneously formed in one process (FIG. 11).

Then, the first interconnect layer 123 is formed on the entire upper surface of the interlayer insulating film 119, and the first interconnect 125 to be connected to the second interconnect connecting plug 109 and the first interconnect 127 to be connected to the dummy plug 121 are simultaneously formed in predetermined regions in the first interconnect layer 123. The semiconductor device 110 shown in FIG. 9 is obtained by the above-described procedure.

According to the present embodiment, the following advantageous effects can be further obtained, in addition to the advantageous effects obtainable by employing the configuration of the first embodiment. The SiN film 118 functioning as the etching stopper is provided to be remote from the upper electrode 139, so that a parasitic capacitance created between the interlayer insulating film 119 and the upper electrode 139 can be further surely reduced. In addition, as will be described as follows, a process for manufacturing the upper electrode connecting plug (FIG. 12) for connecting the first interconnect 127 to the upper electrode 139 can be simplified, and a degree of flexibility in the arrangement of the upper electrode connecting plugs can be enhanced.

FIG. 12 is a cross-sectional view, illustrating another configuration of a semiconductor device 110.

In FIG. 12, the SiN film 118 is terminated in the inside of the edge of the upper electrode 139 in the side of the logic unit toward the interior of the memory unit 104. Then, in a region for forming the SiN film 118, the electroconductive upper electrode connecting plug 143 that couples the first interconnect 127 to the upper electrode 139 is provided. Since the entire lower surface of the upper electrode connecting plug 143 is in contact with the top surface of the upper electrode 139 according to the configuration of FIG. 12, an over etch of the concave portion occurred in the process for forming the upper electrode connecting plug 143 can be further inhibited, as compared with configuration shown in FIG. 7. Consequently, further improved manufacturing stability of the upper electrode connecting plug 143 can be presented. In addition, further improved coupling stability between the upper electrode connecting plug 143 and the upper electrode 139 can be presented.

Figure 13:
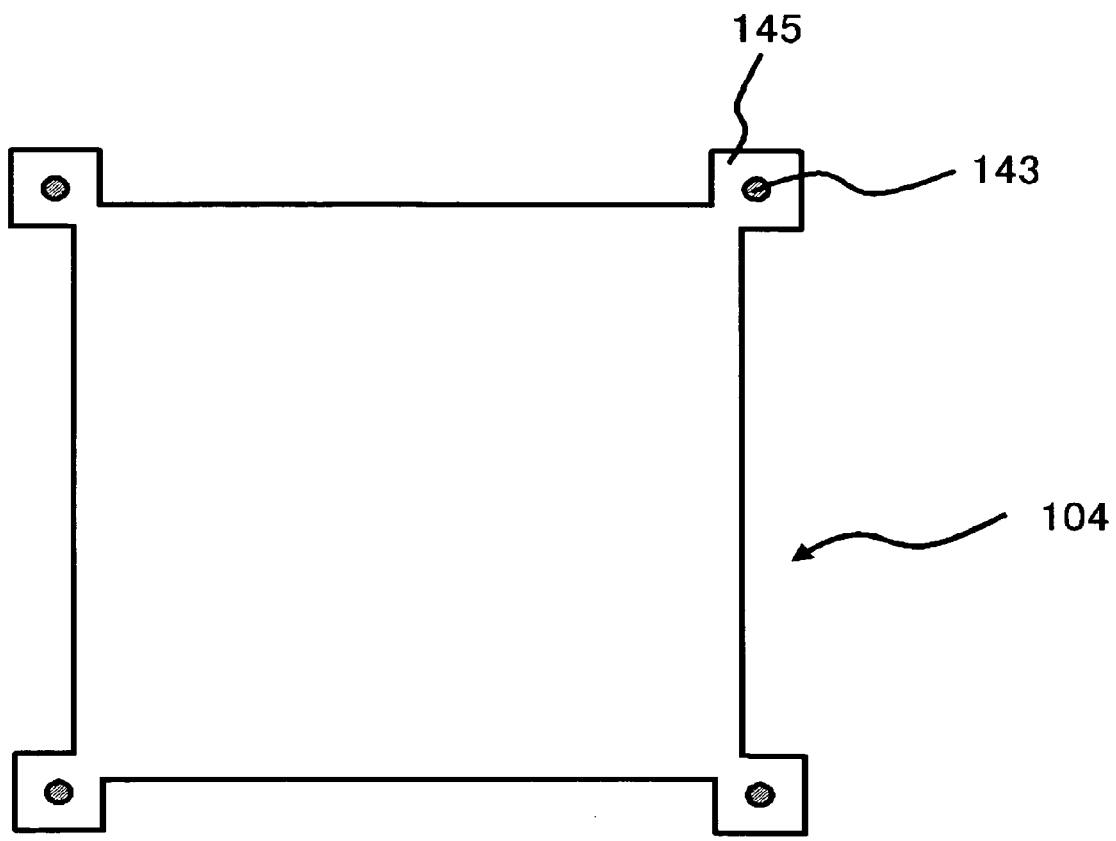
FIG. 13 is a diagram, illustrating a two-dimensional arrangement of upper electrode connecting plugs in a semiconductor device according to the present embodiment.

In addition, a two-dimensional arrangement of the upper electrode connecting plugs 143 may be, for example, the pattern of the upper electrode connecting plugs 141 described above in reference to FIG. 8A and FIG. 8B. In addition, the configuration shown in FIG. 13 may also be adopted. FIG. 13 is a plan view, illustrating an exemplary implementation of a two-dimensional arrangement of the upper electrode connecting plugs 141. In the configuration shown in FIG. 13, protruding portions 145 formed of the four corners of a region for forming a rectangular memory unit protruding in selvage-shape are provided, and an upper electrode connecting plug 143 is disposed in each of the protruding portions 145. Having such configuration, a degree of integration of capacitor elements 115 in the rectangular region can be further improved.

Figure 14:
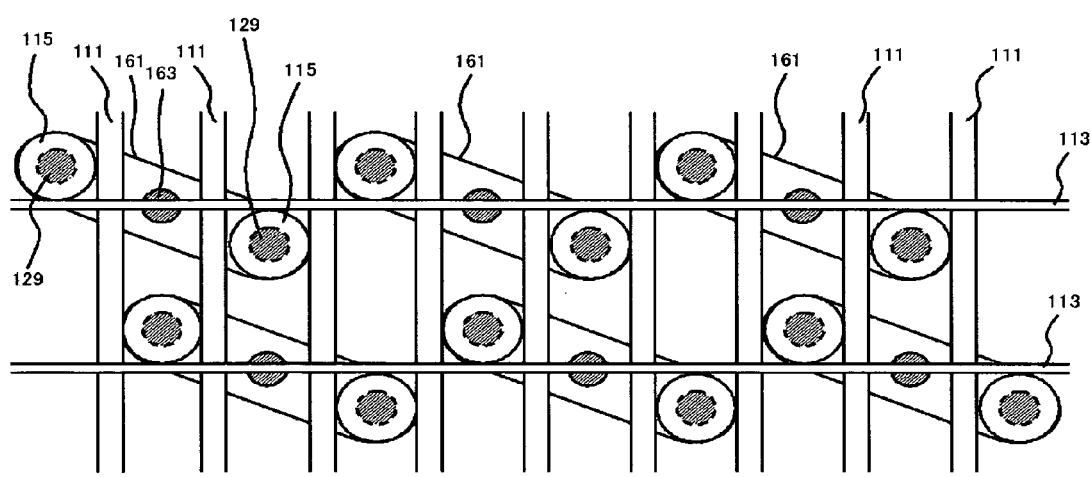
FIG. 14 is a plan view, illustrating a configuration of a memory unit in the semiconductor device according to an embodiment.

In addition to above, while the capacitor elements 115 and the bit lines 113 are schematically shown as being included in the same cross section in the configurations described in the above embodiments in reference to FIG. 1 and FIG. 9, in order to illustrate a positional relationship of the capacitor elements 115 and the bit lines 113 in vertical direction, a two-dimensional arrangement of each member in the memory unit 104 may alternatively be presented as shown in FIG. 14. FIG. 14 is a diagram, illustrating a two-dimensional arrangement of the memory unit 104. In the two-dimensional structure shown in FIG. 14, adjacent two transistors for a memory are configured to commonly utilize a bit line connecting plug 163 that is connected to the bit line 113.

More specifically, a plurality of diffusion layer 161 are disposed in parallel relationship on a device-forming surface of the silicon substrate 101. The diffusion layers 161 elongate in a direction, which is not parallel to an elongating direction of the bit line 113 and not parallel to an elongating direction of the second gate electrode 111. The diffusion layer 161 in one field includes the capacitor connecting plug 129, the bit line connecting plug 163 and the capacitor connecting plug 129, which line in this sequence and serve as three electroconductive plugs disposed along a straight line. The capacitor connecting plug 129 provide an electrical coupling between the diffusion layer 161 and the lower electrode (not shown) of the capacitor element 115. The bit line connecting plug 163 provide an electrical coupling between the diffusion layer 161 and the bit line 113.

In addition, two second gate electrodes 111 (word line) are provided between adjacent electroconductive plugs. The second gate electrode 111 (word line) elongates across the adjacent multiple diffusion layers 161. A plurality of second gate electrodes 111 (word lines) that elongate along a straight line are arranged in parallel. In addition, a plurality of bit lines 113 that elongate along a straight line are arranged in parallel. The second gate electrode 111 and the bit line 113 are mutually-perpendicular.

By employing the two-dimensional arrangement shown in FIG. 14, respective members can be suitably disposed with an appropriate spacing therebetween and a degree of integration of the capacitor elements 115 in the surface can be sufficiently ensured, even in the case of employing a COB structure that includes capacitor elements 115 provided above the bit lines 113.

While the preferred embodiments of the present invention have been described above in reference to the annexed figures, it should be understood that the disclosures above are presented for the purpose of illustrating the present invention, and various configurations other than the above described configurations can also be adopted.

For example, while the above embodiment illustrates the exemplary implementation of forming the second interconnect connecting plugs 109 extending from the interlayer insulating film 103 to the interlayer insulating film 119 in the logic unit 102, the second interconnect connecting plug 109 may alternatively be composed of a plurality of electroconductive plugs. Even in this case, an erosion in the top surface of the interlayer insulating film 119 can also be inhibited by forming the electroconductive plug to be terminated at the top surface of the interlayer insulating film 119 simultaneously with forming the dummy plug 121. In addition, the second interconnect connecting plug 109 may be composed of a plurality of electroconductive plugs, so that aspect ratios of the individual electroconductive plugs can be reduced, thereby providing further improved manufacturing stability for the electroconductive plugs.

In addition, in the above embodiments, an oxide compound or a silicate compound containing one or more metallic element(s) selected from the group consisting of hafnium (Hf), zirconium (Zr), aluminum (Al), lanthanum (La), yttrium (Y) and tantalum (Ta) may be employed for a material of the capacitive film 137.

In addition, a film containing a refractory metal such as, for example, titanium (Ti), tantalum (Ta) and the like may be employed for the barrier metal film, in addition to a titanium nitride (TiN) film as described above. For example, the suitable materials may include titanium (Ti), tungsten nitride (WN), tantalum (Ta), tantalum nitride (TaN) or the like. In addition, a tantalum-containing barrier metal composed of TaN and Ta may also be employed. The barrier metal film may be formed via a process such as a sputter process, CVD and the like.

Various materials may be employed for forming the etching stopper film, in addition to the above-described SiN film 117 and SiN film 118. For example, a material containing nitrogen such as silicon carbon nitride (SiCN), silicon oxynitride (SiON) and the like may be employed.

In addition, the bit line 113 may be extended to a peripheral region of the memory unit 104. For example, the bit line 113 may be employed as a circuit member of the logic unit 102.

It is apparent that the present invention is not limited to the above embodiment, and may be modified and changed without departing from the scope and spirit of the invention.

What is claimed is:

1. A semiconductor device that includes a memory unit and a logic unit in a semiconductor substrate, comprising:
   an insulating layer provided on said semiconductor substrate extending from said memory unit to said logic unit;

a plurality of electroconductive plugs embedded in said insulating layer in said logic unit;

a capacitor element embedded in said insulating layer in said memory unit; and a dummy electrically conductive film, embedded in said insulating layer in a region above a region that is provided with said capacitor element in said memory unit, and insulated from said capacitor element, wherein said plurality of electroconductive plugs and said dummy electrically conductive film are terminated in a top surface of said insulating layer.

2. The semiconductor device according to claim 1, wherein an insulating film is provided between said capacitor element and said dummy electrically conductive film.

3. The semiconductor device according to claim 2, wherein said insulating film is provided to be separated from said capacitor element.

4. The semiconductor device according to claim 3, wherein said capacitor element includes a lower electrode, an upper electrode and a capacitive film provided between said lower electrode and said upper electrode, and wherein said semiconductor device further comprises an electroconductive upper electrode connecting plug, being provided to be separated from said insulating film and being connected to said upper electrode in the lower surface.

5. The semiconductor device according to claim 1, wherein said dummy electrically conductive film and said electroconductive plug are composed of substantially the same material, and wherein a top surface of said dummy electrically conductive film and a top surface of said electroconductive plug are terminated with substantially coplanar relationship.

6. The semiconductor device according to claim 1, wherein said logic unit further includes an interconnect, which is provided so as to contact with the top surface of said electroconductive plug, and wherein a material of said interconnect is different from a material of said dummy electrically conductive film.

7. The semiconductor device according to claim 1, wherein said memory unit further includes a bit line, and said capacitor element is provided above said bit line.

* * * * *